(12) United States Patent
Straussmann (10) Patent No.: US 7,982,649 B2
(45) Date of Patent: Jul. 19, 2011

(54) DEVICE FOR THE LOW-DISTORTION TRANSFORMATION, PARTICULARLY AMPLIFICATION OF SIGNALS

(76) Inventor: Juergen Straussmann, Berlin (DE)

( * ) Notice: Subject to any disclaimer, the term of this patent is extended or adjusted under 35 U.S.C. 154(b) by 0 days.

(21) Appl. No.: 12/519,905

(22) PCT Filed: Dec. 20, 2007

(86) PCT No.: PCT/DE2007/002301
§ 371 (c)(1), (2), (4) Date: Sep. 11, 2009

(87) PCT Pub. No.: WO2008/077387
PCT Pub. Date: Jul. 3, 2008

(65) Prior Publication Data
US 2010/0045375 A1    Feb. 25, 2010

(30) Foreign Application Priority Data
Dec. 22, 2006  (DE) ............... 10 2006 062 648

(51) Int. Cl.
*H03M 1/66* (2006.01)
(52) U.S. Cl. .......................... 341/144; 341/118
(58) Field of Classification Search ............. 341/120, 341/118, 144, 155, 138, 139
See application file for complete search history.

(56) References Cited

U.S. PATENT DOCUMENTS

| | | | |
|---|---|---|---|
| 6,479,740 B1* | 11/2002 | Schwartz et al. | 84/609 |
| 6,549,154 B2* | 4/2003 | Isobe et al. | 341/144 |
| 6,751,447 B1* | 6/2004 | Jin et al. | 455/114.3 |
| 7,388,531 B1* | 6/2008 | Cyrusian | 341/144 |
| 7,579,971 B2* | 8/2009 | Washburn et al. | 341/144 |

* cited by examiner

*Primary Examiner* — Peguy JeanPierre
(74) *Attorney, Agent, or Firm* — Andrew Wilford (57) ABSTRACT

The invention describes a device for the low-distortion conversion, especially amplification, of signals. In one embodiment, the device comprises a digital-to-analog converter having adjustable reference voltages to which an analog-to-digital converter having adjustable reference voltages may be connected upstream. In a further embodiment, the device has a unit, which predistorts a digitized signal, or a digital signal, corresponding to the characteristic transfer line of the amplifier. In a further embodiment, the device has a unit, which equalizes a distorted digitized signal corresponding to the characteristic transfer line of the amplifier stored in the unit. In yet a further embodiment, the device has a digital-to-analog converter operating on the basis of the summation of weighted currents.

24 Claims, 10 Drawing Sheets

DEVICE FOR THE LOW-DISTORTION TRANSFORMATION, PARTICULARLY AMPLIFICATION OF SIGNALS

CROSS REFERENCE TO RELATED APPLICATIONS

This application is the US national phase of PCT application PCT/DE2007/002301, filed 20 Dec. 2007, published 3 Jul. 2008 as WO2008/077387, and claiming the priority of German patent application 102006062648.6 itself filed 22 Dec. 2006, whose entire disclosures are herewith incorporated by reference.

FIELD OF THE INVENTION

The present invention is directed to a device for the low-distortion conversion, especially amplification, of signals.

BACKGROUND OF THE INVENTION

Electrical amplifiers are required in order to amplify signals with respect to voltage, current or power. For this, normally active elements, as transistors or electron tubes, are used. However, transformers can cause an amplification, too.

However, on account of the non-linearity of the characteristic transmission curve of these elements non-linear distortions are generated in the output signal, i.e. additional signal portions which are not present in the original signal. In order to reduce these non-linear distortions the so-called negative feedback is used according to which a portion of the output signal is fed back to the input with a phase shift of 180°. However, this method has substantial disadvantages with non-stationary signals since new signal falsifications are generated on account of different running times.

OBJECT OF THE INVENTION

It is the object of the present invention to provide a device of the above-cited kind with which distortions can be reduced in an especially extensive manner without requiring a negative feedback herefor.

SUMMARY OF THE INVENTION

According to a first embodiment of the invention this object is obtained by the feature that the device includes a digital-to-analog converter with adjustable reference voltages.

This embodiment of the invention is directed to a device for the amplification of digitized analogous signals with regard to the voltage with low distortion wherein the required amplification or the required level of the output voltage results by the adjustment of the reference voltages of the digital-to-analog converter.

According to another embodiment of the invention, which is a device for the amplification of analogous signals with respect to the voltage with low distortion, the device includes an analog-to-digital converter with adjustable reference voltages upstream of the digital-to-analog converter. The required amplification or the required level of the output voltage results by the adjustment of the reference voltages of the analog-to-digital converter and of the digital-to-analog converter.

The above-described embodiments enable the realization of amplifiers with low distortion without the assistance of negative feedbacks.

For example, a device which amplifies a signal which is present either analogous or digitally encoded, for instance in PCM code, to any high voltage, i.e. with an arbitrarily high gain V, with low distortion and without assistance of a negative feedback has the following structure according to the above-described embodiment:

At first, an analogous signal is digitized by an analog-to-digital converter. The selection of the resolution (bit length) and of the sampling rate (with consideration of the Nyquist criterion) determines the quality, i.e. the portion of non-linear distortions, of the subsequent output signal. A signal which is already digitally encoded can be processed directly. In the second step the digitized signal or the signal which is already present digitally is fed to a digital-to-analog converter. This converter takes over the real function of voltage amplification. By selection of the reference voltages +Uref and −Uref of the analog-to-digital converter and especially of the digital-to-analog converter one can directly influence the level of the output voltage and thus the level of the signal amplification on the basis of a corresponding lay-out of the converters. For example, signal voltages of several 100 V can be generated with smallest non-linear signal portions, apart from the signal portions caused by the step-like original shape which, however, can be held as small as desired by the selection of a suitable resolution and sampling rate. Generally, integrated digital-to-analog converters are designed only for relatively low reference voltages (<+−20 V). However, it is possible to construct discrete converters which can also generate high voltages. For this, only the switches have to be correspondingly designed. Often sampling rate and resolution cannot be freely selected but are fixed on account of the system, for example CD standard 44.1 kHz sampling frequency and 16 bit resolution. In order to minimize the non-linear distortions generated during the conversion of a digital signal into an analogous signal a conventional digital-to-analog converter is extended by additional devices.

Preferably, the device is designed in such a manner that the digital-to-analog converter can directly control a subsequent amplifier stage by corresponding design and selection of the reference voltages. In this case the subsequent amplifier stage can be the output stage of an audio amplifier, and the digital-to-analog converter can directly provide the necessary control voltage or control current by corresponding design.

For example, the device can be used for the analogous signal processing (amplification) in an audio amplifier. It can convert digital audio signals into analog signals in such a manner that the output stage in an audio amplifier can be directly controlled.

Figure 3:
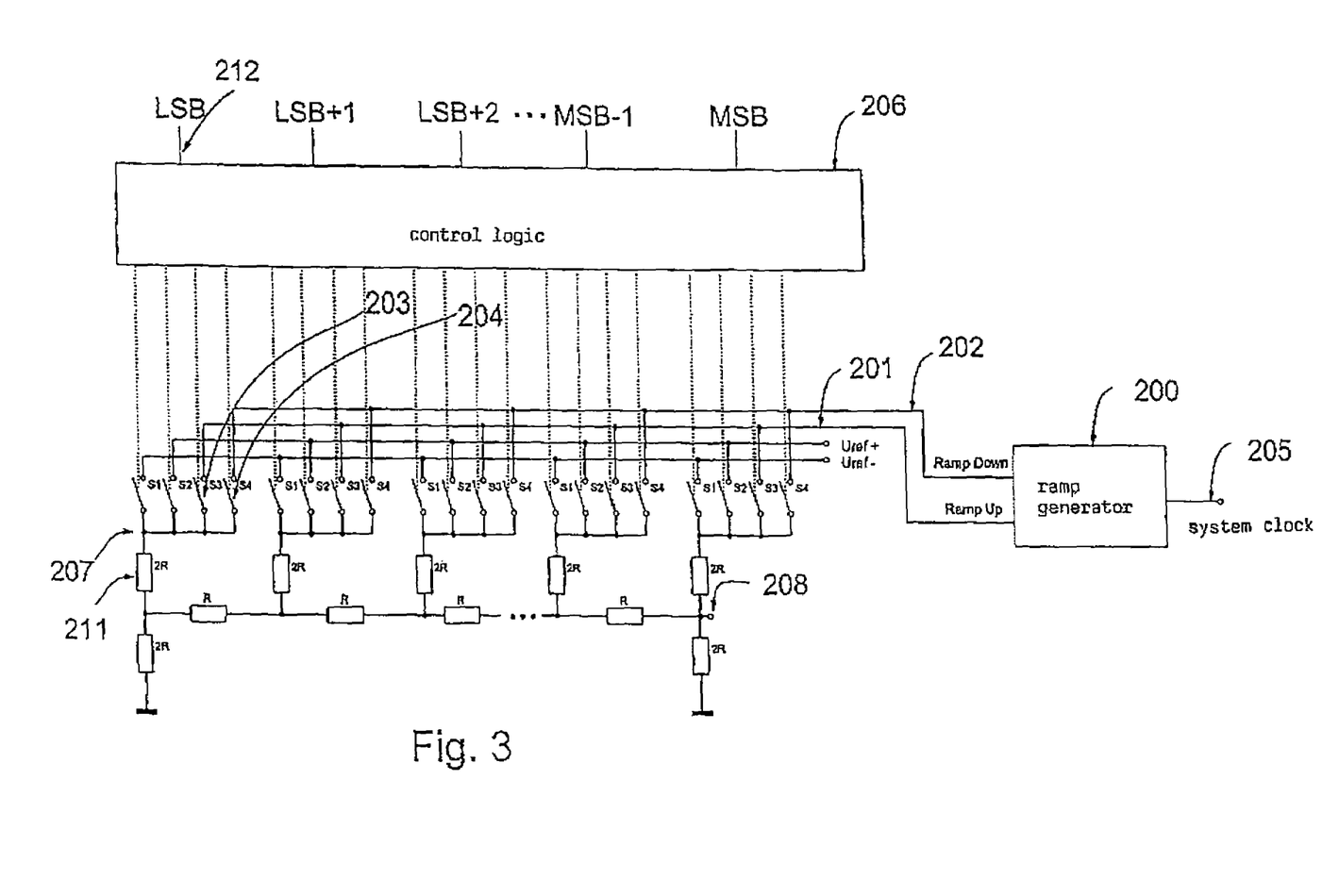
FIG. 3 shows the construction of an inventive digital-to-analog converter with integrated analog smoothing.

According to another embodiment of the inventive device the digital-to-analog converter includes furthermore:

Per each bit a group of four switches S1-S4, an inversely operated R-2R-R network, a generator for the generation of clock-synchronous increasing and decreasing voltages and per each bit a control logic which controls the switches S1-S4 wherein the control logic applies either Uref+, Uref−, URampUp or URampDown to point 207 of the resistor 2R 211 through the switches S1-S4 in such a manner that the value of a bit of two subsequent clocks is evaluated wherein with a L/L sequence S1 is closed,
with a L/H sequence S3 is closed,
with a H/L sequence S4 is closed and
with a H/H sequence S2 is closed.

An analog signal which is generated from digital values by a digital-to-analog converter, on principle, has stair steps with the width of the clock of the digital-to-analog converter. Additionally, such a signal contains strong portions of the clock frequency as well as of further higher frequencies. Accordingly, one wishes to smooth these stair steps in the best possible manner (smoothing). Normally, for this filters are used which reach from simple low pass filters up to filters of higher order. The same are partly realized as digital filters by digital signal processors, too. However, filters often have undesired characteristics (phase displacements, overshoots, transient times etc.).

By means of the inventive device in the digital-to-analog converter an automatic analogously generated smoothing (linear interpolation) results which minimizes the system-relevant non-linear distortions generated by the conversion process so that further filtering measures are not necessary. This can be realized by the inventive solution with only one specific digital-to-analog converter and without steps between the sampling values.

Customarily, digital-to-analog converters are realized by means of a resistance network. For example, it is cited here the network R-2R-R. In this case, the branches with the 2R resistors are applied to U+ or U−, respectively, through switches S1 and S2 corresponding to the value of the respective bits. Preferably, the switches are realized with semiconductor switches.

For the realization of an integrated smoothing this arrangement can be modified in the following manner:

At first, two ramp signals are generated by a generator synchronously with respect to the system clock (sampling clock), one which increases from U− to U+ and one which decreases from U+ to U−. Furthermore, two further switches S3 and S4 are introduced per 2R branch. Accordingly, one can apply to the corresponding 2R resistor either U+ (S1), U− (S2), an increasing ramp U− to U+ (S3) or a ramp (S4) decreasing from U+ to U−.

Figure 4:
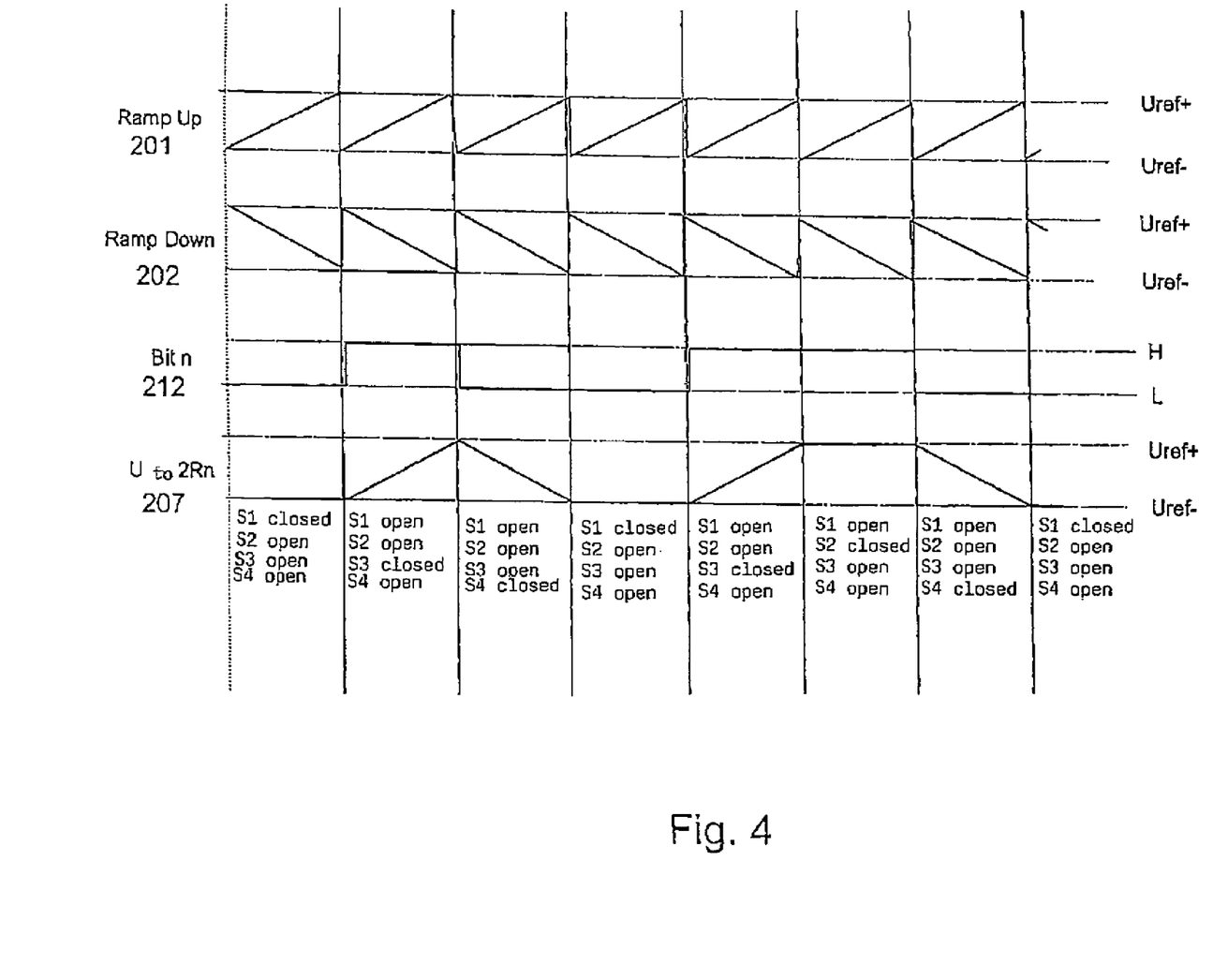
FIG. 4 shows the function of the digital-to-analog converter of FIG. 3 for one bit.

The switches S1 to S4 are controlled by a control logic in the following manner:

If it is assumed that the binary input signal was L up to now then the switch S1 was closed as with the conventional digital-to-analog converter. U− is present at the point 207 of the 2R resistor. If the input signal changes to H S1 is opened. However, not S2, as up to now, but S3 is closed. Thereby, the ramp increasing from U− to U+ is applied to 2R. At the end of the clock the voltage at 2R (207) reaches U+. If the input signal remains also in the next clock at H S3 is opened and S2 is closed. Then U+ is constantly present at 2R (207). However, if the signal changes to L S3 is opened and S4 is closed and thus the ramp decreasing from U+ to U− is applied to 2R (207). Accordingly, the voltage at the end of the clock has again dropped to U−.

According to this principle the control logic controls the switches S1 to S4 of all stages of the digital-to-analog converter. Consequently, an output voltage of the digital-to-analog converter results as it is shown in the following FIG. 5. The kind of "looping" can be varied by different ramp shapes.

Another improvement of the smoothing can be reached as follows:

The input values of the digital-to-analog converter are changed in the following manner:

$$DAin(t+1) = N(t) + (N(t+1) - N(t))/2$$

N are the original digital values.

This can be realized by a microprocessor which is located upstream of the digital-to-analog converter and carries out this calculation. In the following FIG. 5 the effect of the two smoothing functions compared with the conventional digital-to-analog converter is shown. The solid line shows the simple smoothing while the dot-dashed line shows the improved smoothing.

Another optimization of the smoothing can be reached by modification of the form of the ramp voltage. Instead of a linear ramp two "bulgy" ramps are used, namely a concave one and a convex one, thus totally four ramps, two for UP and two for DOWN. Furthermore, during the output of a value one considers already the next value. If the distance between the actual value and the preceding value is smaller than the distance between the actual value and the next value the convex ramp is used, otherwise the concave ramp. For the other case the relations are reversed. According to this kind of the procedure the corresponding analog signal becomes even smoother. However, the expense increases.

Digital-to-analog converters of the above-described kind are excellently suited for the realization as integrated circuits. Additionally, they are characterized by low noise of the output signal since the current flow in the resistors 2R does not change stepwisely at the switch processes and thus disturbances by current discontinuities are avoided.

Accordingly, the above-described device is directed to such a device according to which the ramp voltage increases or decreases linearly. In another embodiment the ramp voltage has a shape deviating from the linear shape.

Preferably, another means is provided which changes the digital input value prior to the output to the digital-to-analog converter such that the value for the clock T+1 results from the mean value between the value for the clock T+1 and that of the clock T.

As cited above, according to the invention furthermore a device is proposed according to which in the digital-to-analog converter more than two ramps for the further optimization of smoothing are generated which can be applied to the points (207) of the 2R resistors through corresponding additional switches.

The digital data can be represented by digitized music data. The device can be used in an integrated circuit (IC) as digital-to-analog converter.

If the use of active elements, as for instance transistors or electron tubes, cannot be avoided in order to obtain a necessary power amplification for the controlling of a load additional signal portions not present in the original signal (non-linear distortions) are generated on account of the non-linear characteristic transmission curve of these elements. These distortions are reduced by negative feedback measures according to the prior art. By means of another inventive solution described in the following an extensive reduction of the distortions occurring on account of non-linearities can be reached.

This solution is directed to a device for the reduction of distortions in electrical amplifiers which are caused by non-linearities in the active elements wherein this device includes the following components:

a unit which predistorts a digitized signal or a digital signal according to the characteristic transfer line of an amplifier, a unit in which the characteristic transfer line or its inversion is stored, and a digital-to-analog converter which generates an analog signal from the digital predistorted signal and controls the amplifier with this signal wherein the distortions of the amplifier are compensated by the predistortion of the input signal so that on the whole an amplification with low distortion results in spite of the non-linearity of the amplifier.

The inventive device can process not only analog signals but also digitized signals. An analog signal is digitized by an analog-to-digital converter prior to further processing. The digitized values are supplied to a unit which, having knowledge of the non-linearity of the characteristic transfer line of the amplification system which has to be linearized, modifies these values such that an output signal with low distortion results after the subsequent passing of the non-linear system. For this, the input values have to be multiplied with the inverse transfer function. This causes a digital predistortion of the signal.

Subsequently, the digital signal predistorted in such a manner is given to a digital-to-anlog converter the output signal of which directly controls the amplifier stage which has to be linearized. With a corresponding layout of the digital-to-analog converter the same can fulfil each possible requirement for the control of the amplifier stage, for example by correspondingly high reference voltages +Uref and −Uref and high output voltages for the direct control of the grids of an electron tube. This signal is amplified by the active element and generates non-linear distortions. By the fact that the signal was already predistorted by the digital-to-analog converter with the inverse transfer function both distortions compensate themselves so that on the whole a non-distorted signal results at the output of the amplifier system.

This device presupposes the knowledge of the non-linearity of the amplifier which is fixedly stored as inverse function. If the non-linear performance changes dependent on time and/or temperature this device does no more operate best.

In order to overcome these problems according to another embodiment of the invention the device includes additionally a unit for the measurement-technical evaluation of the output signal of the amplifier, a unit for processing the data as well as a unit which is suited to permanently store the characteristic transfer line or its inversion on the one side and to enable modifications of the several values during the operation on the other side wherein with each output of a new digital value the unit for the measurement-technical evaluation detects the output signal in a measurement-technical manner and transmits the same to the unit for processing the data which then carries out a comparison between the desired value and the actual value of the values and corrects the respective value of the characteristic transfer line upon deviations whereby the function of the device remains always guaranteed even at variations of the characteristic line within the amplifier (adaptive performance).

The unit which enables modifications of the individual values is preferably initialized at first with the function y=x so that after a short time the characteristic line of the amplifier or the inverse thereof independently adjusts itself on account of the function of the device.

The above-described device has the advantage that it independently adapts itself to variations of the characteristic transfer line (adaptive performance). Optionally, one can also desist from a first reception of the transfer function since the device adjusts itself to a minimum distortion after a certain learning phase. In other words, it "learns" independently the characteristic transfer line of the amplifier.

For this, the device is supplemented by further means. A measuring means measures the output signal after each output of a new value by the digital-to-analog converter. Another means compares this digitized actual value with the digitized desired value, i.e. the non-distorted digital input signal. The actual inverse characteristic transmission line is managed in the unit serving herefor. When the operation is taken up for the first time it is initialised with a characteristic transmission line for the beginning, for example with the function y=x. If the further means determines a deviation between the digital desired value and the measured actual value it corrects the respective value in the inverse characteristic transmission line correspondingly. This correction can be carried out differently strong so that it takes a correspondingly long time until the "correct" correction function corresponding to the inverse characteristic transfer function adjusts itself on the whole.

The two above-cited devices use a predistortion of the input signal of the non-linear amplifier system. Alternatively, also the output signal of a non-linear amplification system can be corrected thereafter so that the non-linear distortions are reduced. According to this solution the invention proposes a device which includes:

an analog-to-digital converter which converts the analog output signal of the amplifier into a digital signal,
a unit which equalizes or corrects the distorted digitized signal corresponding to the characteristic transfer line of the amplifier stored in a unit and, possibly, provides the same for digital further processing,
a unit in which the characteristic transfer line or inversion thereof has been stored, and
a digital-to-analog converter which generates an analog signal from the digital corrected signal, wherein the non-linear distortions generated in the amplifier are compensated by the correction of the output signal by means of the characteristic transfer line of the amplifier or the inverse thereof stored in the unit so that, on the whole, a low-distortion amplification results in spite of the non-linearity of the amplifier.

According to this embodiment the analog signal which is to be amplified is amplified by a non-linear amplifier. On account of the non-linearity of the amplifier system the output signal contains additional distortions. This signal is digitized by the analog-to-digital converter and is multiplied by a correction unit with the inverse characteristic transfer line. At its output one obtains the low-distortion signal in digital form for a possible digital further processing. Finally, the signal passes a digital-to-analog converter which generates the signal in analog form wherein the signal level is arbitrarily adjustable by means of the reference inputs of the digital-to-analog converter.

If the inverse characteristic transfer line is to be ascertained by the device itself and/or is to be adapted independently to variations (adaptive performance) the above-described device is to be supplemented by further means. A measuring means measures the input signal. Another means compares the digitized actual value which adjusts itself at the output of the unit after the input signal has passed the amplifier system, the analog-to-digital converter and the correction means with the digital desired value, the non-distorted digital input signal. The actual inverse characteristic transfer line is managed in the unit. It is initialized with a characteristic transfer line for the beginning when it is taken in operation for the first time, for instance with the function y=x. If the unit determines a deviation between the digital desired value and the resulting actual value it corrects the respective value in the inverse characteristic transfer line correspondingly. The correction can be carried out differently strong. It takes a correspondingly long time until the "correct" correction function corresponding to the inverse characteristic transfer function adjusts itself.

Accordingly, in another embodiment of the invention the device includes additionally a unit for the measurement-technical evaluation of the input signal of the amplifier, a unit for processing the data as well as a unit which is suited to permanently store the characteristic transfer line or the inversion thereof on the one side and to enable modifications of the individual values during the operation by the unit on the other side wherein the input signal of the amplifier is detected in a measurement-technical manner by the unit and is supplied to the unit for processing the data which then carries out a comparison between the desired value and the actual value of the values and corrects the respective value of the characteristic transfer line which is stored in the unit for storing upon the presence of deviations whereby the function of the device remains always guaranteed even at variations of the characteristic line within the amplifier (adaptive performance).

Here, preferably, the unit for storing is initialized at first with the function y=x wherein after a short time the characteristic line of the amplifier or the inverse thereof adjusts itself independently on account of the function of the device.

Preferably, the non-linear amplifier is a general amplifier for the voltage, current or power amplification. The non-linear amplifier is especially the output stage of an audio amplifier. However, it can be also a preamplifier stage of an audio amplifier.

When the device is used in an audio amplifier the digital-to-analog converter generates preferably a signal in such a manner that the analog output stage of the audio amplifier can be directly controlled.

Furthermore, the above-cited object is achieved with a device for the low-distortion conversion, especially the amplification, of signals according to the invention by the fact that a digital-to-analog converter operating on the basis of the summation of weighted currents transfers the summed individual currents directly to a load whereby a corresponding power is transferred to the load.

Preferably, in this case the device serves for the amplification of digital signals with respect to power. The provision of the individual part-currents can be carried out through individual current sources or through conductor networks.

Such a device can be designed as low-distortion power amplifier, especially for audio use.

Normally, power amplifiers are realized by means of active elements, as transistors or electron tubes. The generated non-linear distortions can be reduced by negative feedback measures according to the prior art. The inventive device is able to amplify digital signals with respect to power with smallest distortions without the use of negative feedback measures. For this, a digital-to-analog converter is used which operates on the basis of weighted currents. These can be generated either through conductor networks or through switchable weighted constant current sources. Individual part currents are directly applied to the load R and cause there directly a power discharge of $P=I2*R$. The ratio of the part currents is always 1:2:4:8 . . . . The desired gain of the amplifier can be adjusted through the absolute height of the part currents.

BRIEF DESCRIPTION OF THE DRAWING

In the following the invention is described by means of examples in connection with the drawing in detail. Of the drawing.

SPECIFIC DESCRIPTION

Figure 1:
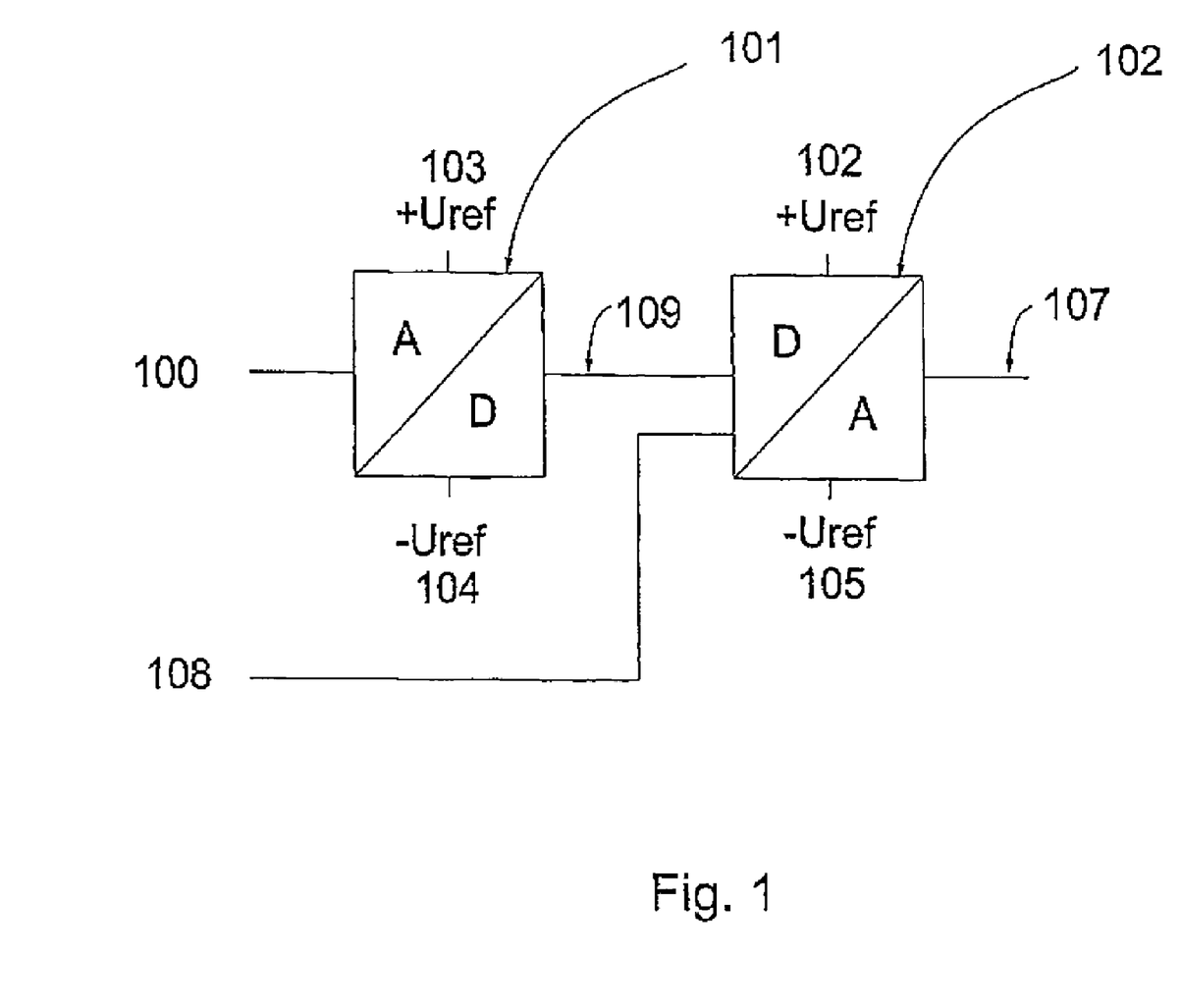
FIG. 1 shows a block diagram of a first embodiment of a device for the low-distortion amplification of signals.

FIG. 1 shows the construction of a device for the low-distortion voltage amplification of analog signals 100 or digitized signals 108 without making necessary a negative feedback. The analog signal 100 is converted into a digital signal 109 by means of the analog-to-digital converter 101 and is subsequently reconverted into an analog signal 107 of whatever level by means of the digital-to-analog converter 102 wherein the amplification is determined by selection of the suitable reference voltages 102 and 103. A possibly digitized signal is also converted into an analog signal of whatever level by the digital-to-analog converter 102.

Figure 2:
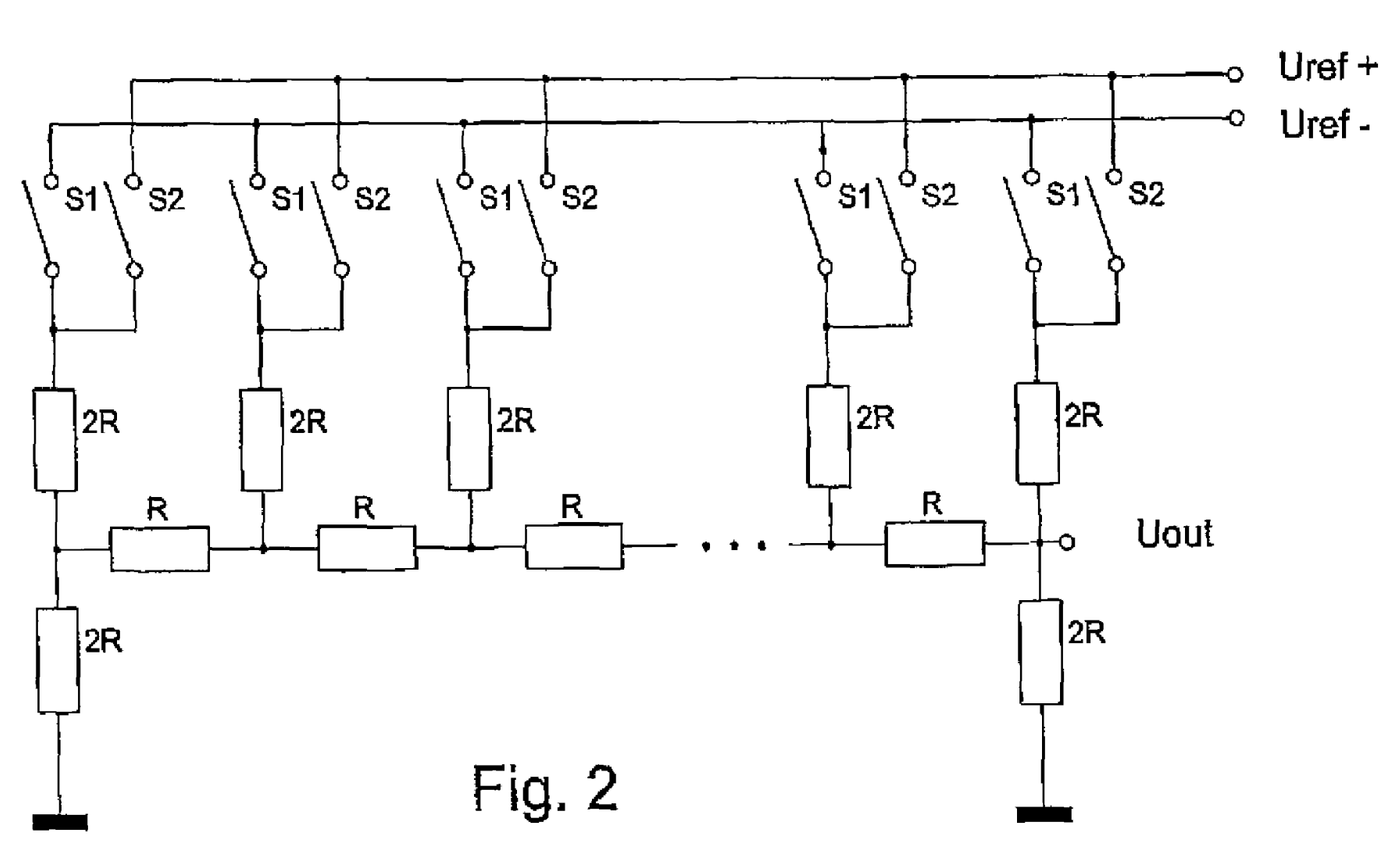
FIG. 2 shows the construction of a conventional digital-to-analog converter with an inversely operated R2R conductor network.

FIG. 2 shows the construction of a conventional digital-to-analog converter with an inversely operated R2R network. Corresponding to the respective bit value the switches S1 and S2 apply the upper resistors 2R either to Uref+ or to Uref−.

FIG. 3 shows the construction of an inventive digital-to-analog converter with integrated analog smoothing. A ramp generator 200 generates sampling clock-synchronously an ascending ramp 201 and a descending ramp 202, respectively. For each bit, in addition to the customary switches S1 and S2, two additional switches S3 203 and S4 204 are present by means of which dependent on the bit sequence, controlled by a control logic 206, either one of the reference voltages or one of the ramps can be applied to the respective 2R resistor 211. Herewith, one obtains subsequently an optimum smoothing.

FIG. 4 shows the function of this digital-to-analog converter for one bit. Shown are the clock-synchronously generated ramps RampUp 2001 and RampDown 202, the input signal 212, the function of the switches S1 to S4 dependent on the input signal and the voltage at point 207 at resistor 2R 211.

Figure 5:
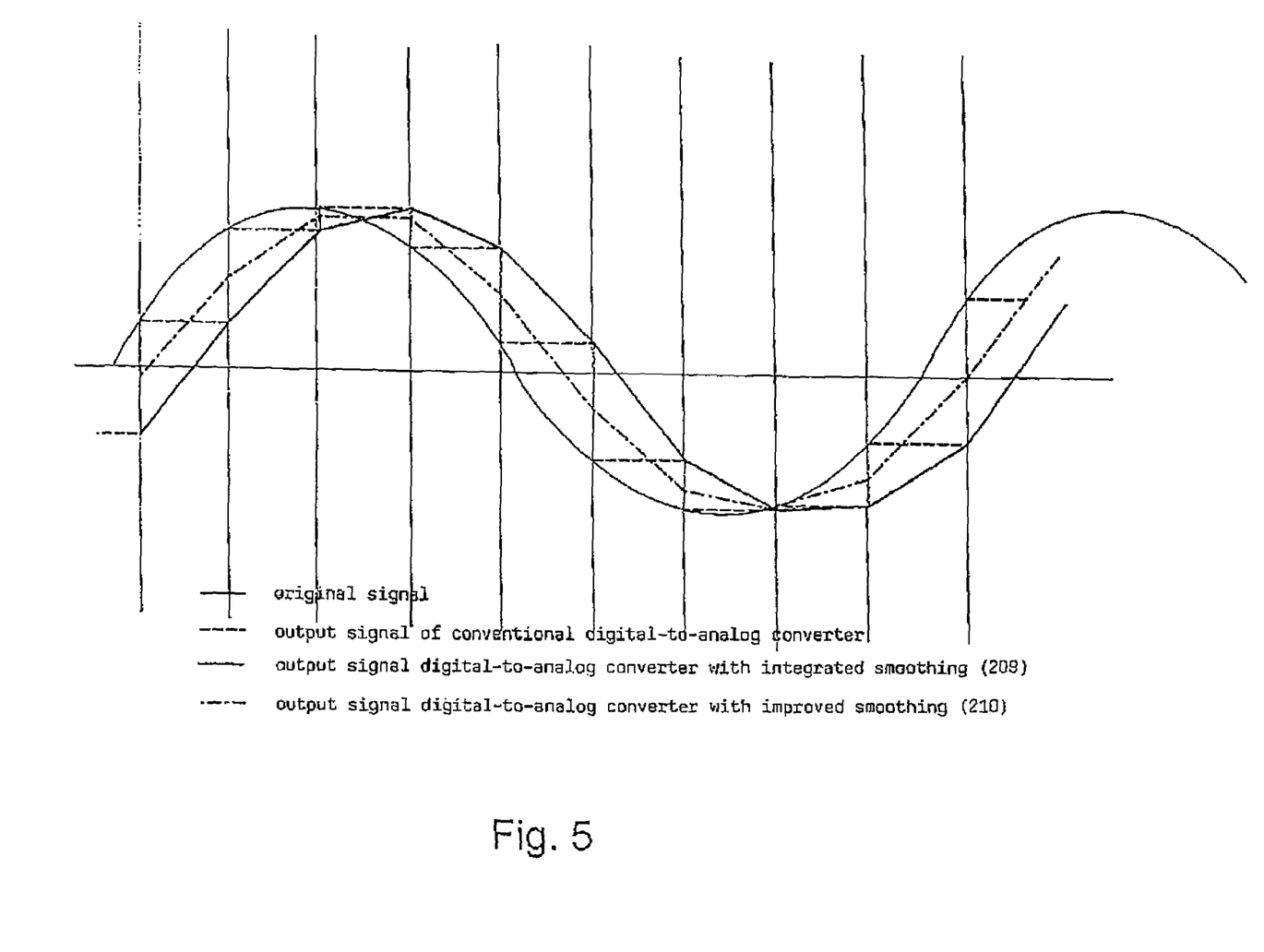
FIG. 5 shows the effect of the smoothing with respect to an input signal.

FIG. 5 shows the effect of the smoothing on an input signal. The dashed line shows the output voltage of a digital-to-analog converter without smoothing, the solid line 209 shows the output voltage of the inventive digital-to-analog converter with smoothing and the dot-dashed line 210 shows the output voltage of the inventive digital-to-analog converter with improved smoothing.

Figure 6:
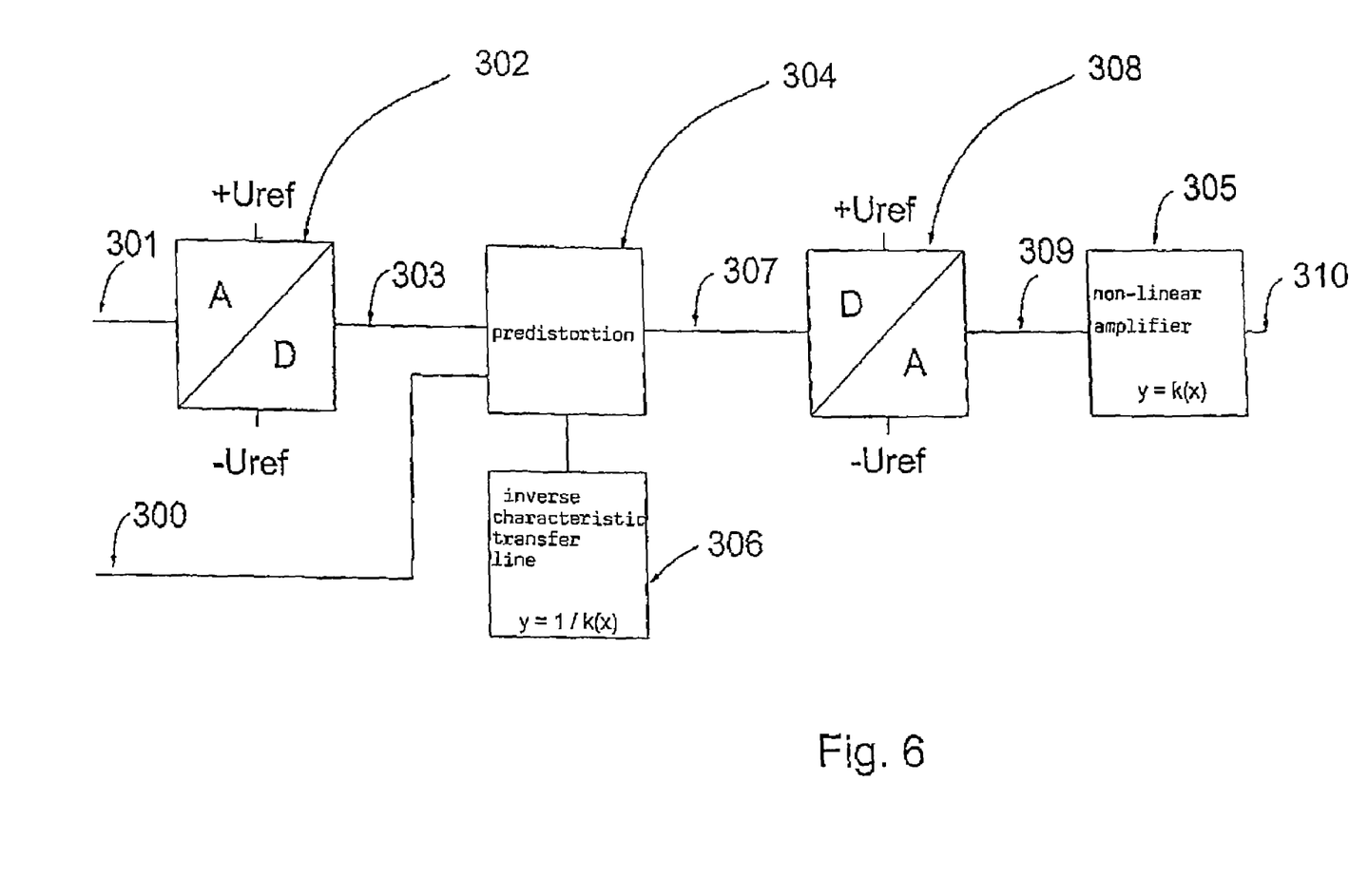
FIG. 6 shows a block diagram of another embodiment of a device for the low-distortion amplification of signals.

FIG. 6 shows the construction and the function of a device for the reduction of distortions which are generated in a non-linear amplification system 305. The analog input signal 301 is digitized (303) with the analog-to-digital converter 302. An alternative digital input signal 300 is, as the digitized analog signal 303, subjected to a predistortion in the unit 304 with consideration of the inverse characteristic transfer line 306 of the non-linear amplification system 305. In such a predistorted condition it is reconverted (309) into an analog signal by a digital-to-analog converter 308 wherein this analog signal serves as input signal for the amplifier 305. The amplifier amplifies the signal 309 non-linearly wherein on the whole a linear course for the output signal 310 results since predistortion and non-linear distortion compensate.

Figure 7:
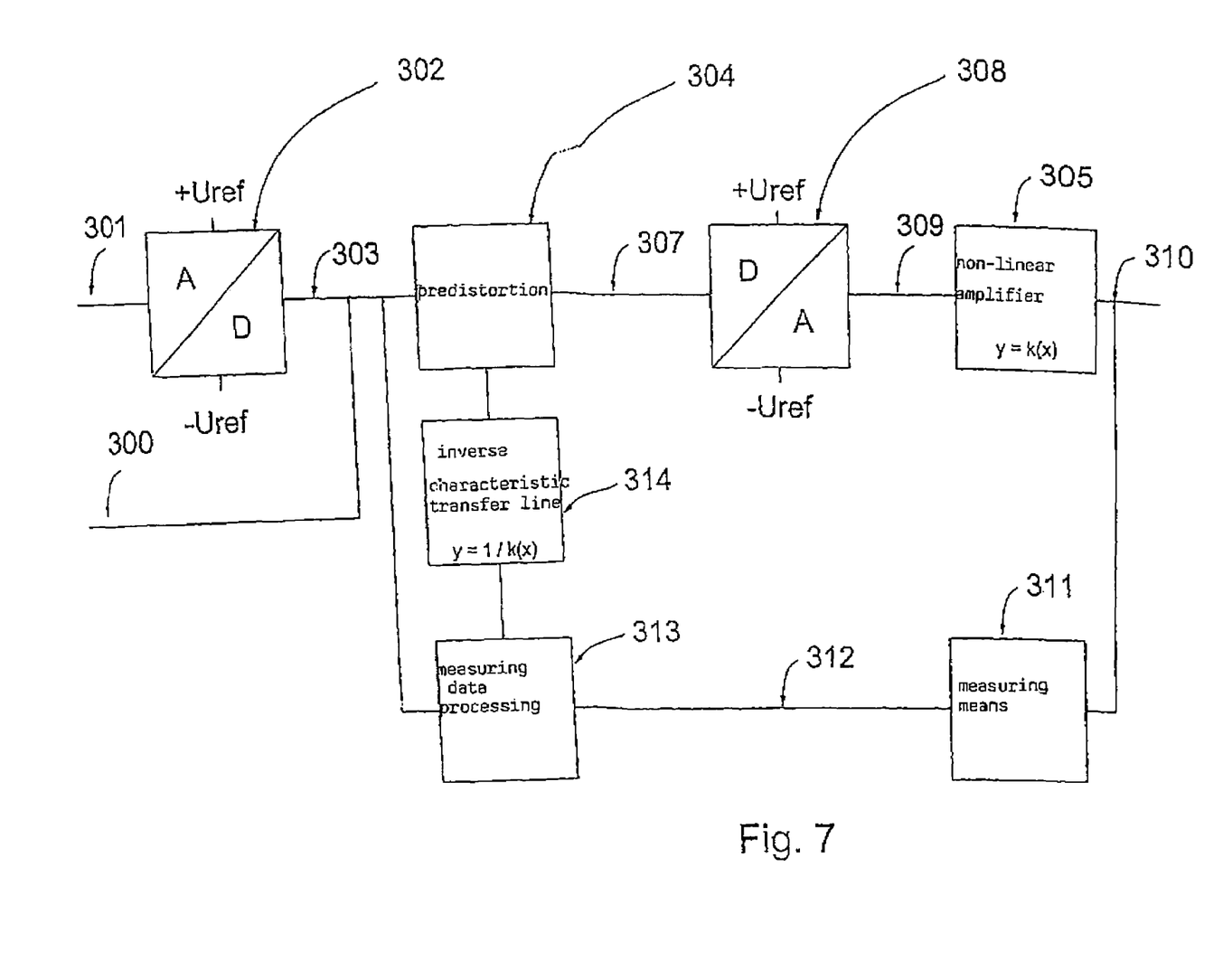
FIG. 7 shows a block diagram of still another embodiment of a device for the low-distortion amplification of signals.

FIG. 7 shows the design of another device for the reduction of distortions which are generated in a non-linear amplification system 305. The design is similar to that of FIG. 6. While in the device according to FIG. 6 the inverse characteristic transfer line is fixedly anchored in 306 it can be corrected by the device of FIG. 7 and/or ascertained itself so that an optimum low-distortion operation is guaranteed under all operating conditions. For this, the output signal 310 of the amplification system 305 is measured through the unit 311. This measuring value 312 which represents the actual value is compared with the desired value 303 through the unit 313. The respective point of the inverse characteristic transfer line 314 is corrected by means of the deviations.

Figure 8:
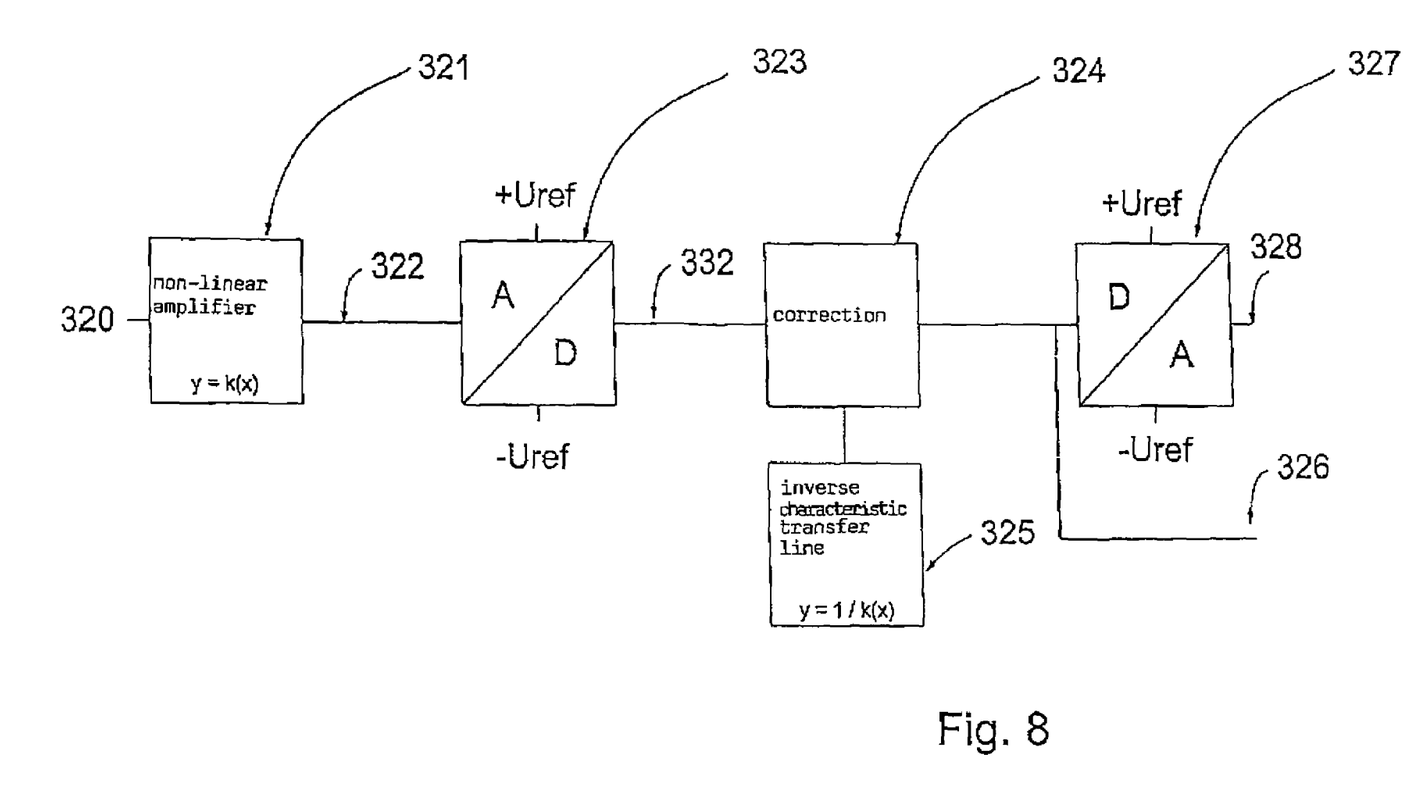
FIG. 8 shows a block diagram of another embodiment of a device for the low-distortion amplification of signals.

FIG. 8 shows the design and function of another device for the reduction of distortions which are generated in a non-linear amplification system 321. In contrast to the embodiment of FIG. 6 the analog input signal 320 is at first amplified by the non-linear amplifier 321. The amplified distorted signal 322 is digitized (303) by means of the analog-to-digital converter 323 and is corrected in the unit 324 on account of the inverse characteristic transfer line 325 of the non-linear amplification system 321. This non-distorted digital signal 326 is converted into a non-distorted analog signal of any voltage level, adjustable by selection of the suitable reference voltages of the digital-to-analog converter 327, by the digital-to-analog converter 327.

Figure 9:
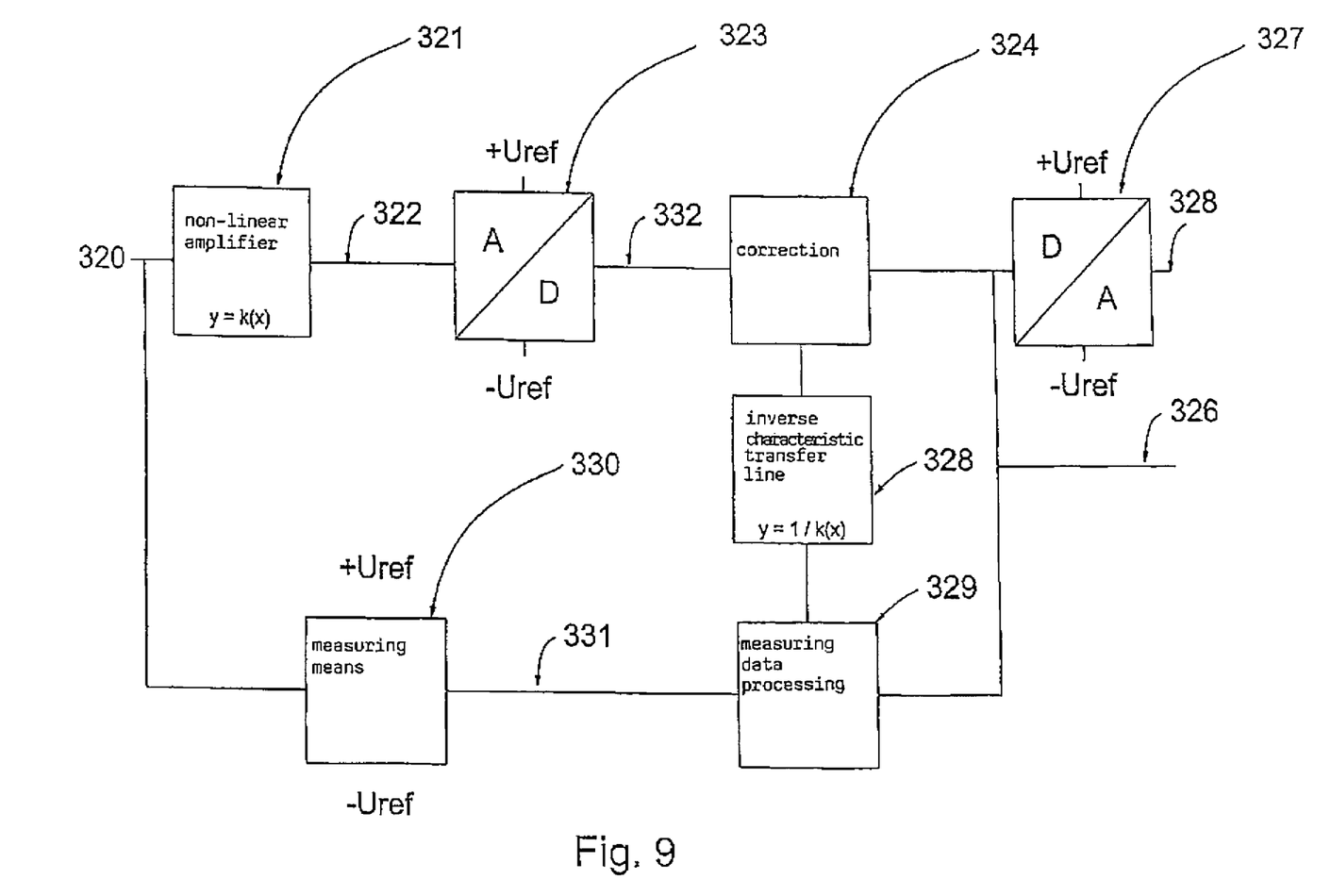
FIG. 9 shows a block diagram of another embodiment of a device for the low-distortion amplification of signals.

FIG. 9 shows the design of another device for the reduction of distortions which are generated in a non-linear amplification system 321. The design is similar to that of FIG. 8. While in the device according to FIG. 8 the inverse characteristic transfer line is fixedly anchored in 325 it can be corrected by the device of FIG. 9 and/or it can be ascertained itself so that an optimum low-distortion operation is guaranteed under all operating conditions. For this, the input signal 320 of the amplification system 321 is measured through the unit 330. This measuring value 331 which represents the desired value is compared with the actual value 326 by the unit 329. The respective point of the inverse characteristic transfer line 328 is corrected by means of the deviations.

Figure 10:
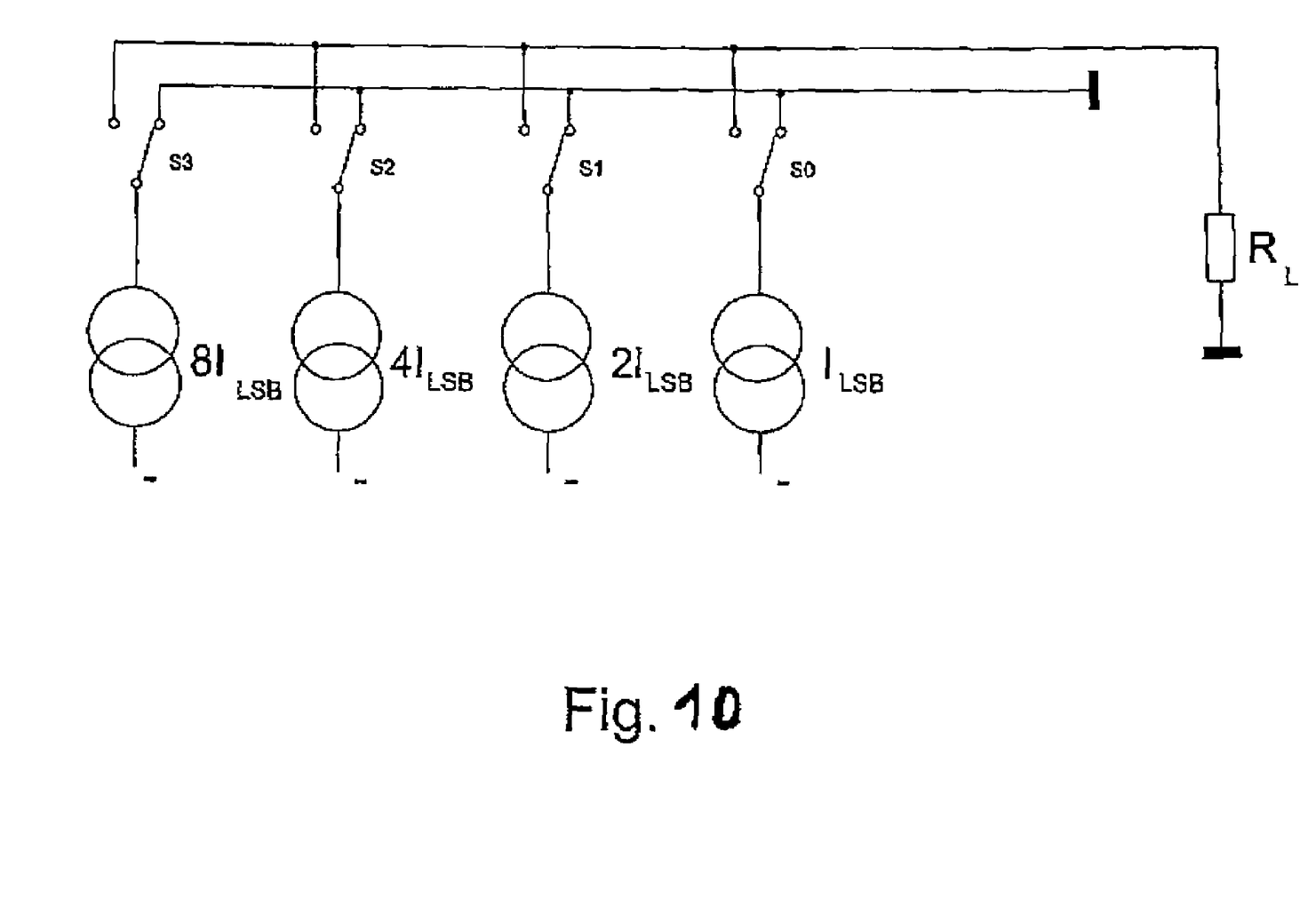
FIG. 10 shows a circuit diagram of a device for the power amplification of a digital signal.

FIG. 10 shows a device for the power amplification of a digital signal, here realized by a digital-to-analog converter with weighted current sources.

Additionally, it is to be pointed to the following. The above-mentioned output stage can be also realized by the output stage of a video amplifier. Accordingly, the device can also serve for the analog signal processing (preamplification) in a video amplifier. This is also true for an amplifier of the measuring, controlling and regulating technique. The device can be generally used for the general amplification of signals.

Furthermore, the device can convert digital picture data (video signals) into analog signals such that the output stage in a video amplifier is directly controllable. This is also true for digitized signals in an amplifier of the measuring, controlling and regulating technique.

The digital signals can be represented by digitized picture data (video signals). The digitized data can be general digitized physical data (measuring data).

The amplifier can be a video amplifier or an amplifier of the measuring, controlling and regulating technique.

The digital-to-analog converter can also generate a signal in such a manner that the analog output stage or prestage of a video amplifier or the analog output stage or prestage of an amplifier of the measuring, controlling and regulating technique can be controlled directly.

The device for a low-distortion conversion which includes a digital-to-analog converter operating on the basis of the summation of weighted currents can be used, for example, for video applications or for applications of the measuring, controlling and regulation technique.

The invention claimed is:

1. A device for the low-distortion conversion or amplification of signals, the device including a digital-to-analog converter with adjustable reference voltages, the digital-to-analog converter furthermore including:
per each bit a group of four switches S1-S4, an inversely operated R-2R-R conductor network, a generator for the generation of clock-synchronous increasing and decreasing ramp voltages and per each bit a control logic which controls the switches S1-S4 wherein the control logic through the switches S1-S4 applies either Uref+, Uref−, URampUp or URampDown to a point of the resistor 2R such that the value of a bit of two successive clocks is evaluated wherein
at a L/L sequence S1 is closed,
at a L/H sequence S3 is closed,
at a H/L sequence S4 is closed, and
at a H/H sequence S2 is closed.

2. The device according to claim 1, further comprising an analog-to-digital converter with adjustable reference voltages upstream of the digital-to-analog converter.

3. The device according to claim 1, wherein the digital-to-analog converter directly controls a following amplification stage.

4. The device according to claim 3, wherein the following amplification stage represents the output stage of an audio amplifier and that the digital-to-analog converter directly provides a control voltage or a control current necessary herefor by a corresponding design.

5. The device according to claim 1, wherein the device serves for analog signal processing in an audio amplifier.

6. The device according to claim 1, wherein the device converts digital audio signals into analog signals such that the output stage in an audio amplifier is directly controllable.

7. The device according to claim 1, wherein the ramp voltages increase or decrease linearly.

8. The device according to claim 1, wherein the ramp voltages have shapes deviating from a linear shape.

9. The device according to claim 1, further comprising another means for modifying digital input values prior to the output to the digital-to-analog converter such that the value for one of the clocks results from a mean value between a value for the one clock and a value for the other of the clocks.

10. The device according to claim 1, wherein in the digital-to-analog converter more than two ramp voltages for further smoothing optimization are generated and are applied to the points of the 2R resistors by corresponding additional switches.

11. The device according to claim 1, wherein the digital signals are digitized music data.

12. The device according to claim 1, wherein the device is used in an integrated circuit as digital-to-analog converter.

13. A device for the low-distortion conversion or amplification of signals, the device comprising:
means for predistorting a digitized signal or a digital signal corresponding to the characteristic transfer line of an amplifier,
means for storing a characteristic transfer line or the inversion thereof,
a digital-to-analog converter that generates from the digital predistorted signal an analog signal and controls an amplifier with this generated signal, the distortions of the amplifier being compensated for by the predistortion of the input signal to form a low-distortion amplification in spite of non-linearity of the amplifier,
means for the measurement-technical evaluation of the output signal of the amplifier,
means for processing the data, and
means for permanently storing the characteristic transfer line or the inversion thereof on the one side and enabling modifications of the individual values during the operation of the processing means for the data on the other side wherein with each output of a new digital value the unit for the measurement technical evaluation of the output signal detects the output signal in a measurement-technical manner and supplies same to the means for processing the data which then carries out a comparison between desired values and actual values and, upon deviations, corrects the respective value of the characteristic transfer line stored in the means for permanently storing the characteristic transfer line whereby the function of the device remains always guaranteed even at variations of the characteristic line within the amplifier.

14. The device according to claim 13 wherein the unit at first is initialized with the function y=x and that after a short time the characteristic line of the amplifier or of the inversion thereof adjusts itself independently on account of the function of the device.

15. The device according to claim 13, wherein the non-linear amplifier or is a general amplifier for the amplification of voltage, current or power.

16. The device according to claim 13, wherein the non-linear amplifier or is the output stage of an audio amplifier.

17. The device according to claim 13, wherein the non-linear amplifier is a preamplification stage of an audio amplifier.

18. The device according to 13, wherein the digital-to-analog converter generates a signal in such a manner that the analog output stage of the audio amplifier can be directly controlled.

19. A device for the low-distortion conversion or amplification, of signals, the device comprising:
   an analog-to-digital converter that converts the analog output signal of an amplifier into a digital signal;
   means for correcting the distorted digital signal through a stored characteristic transfer line of the amplifier and providing the corrected digital signal for further digital processing;
   means for storing the characteristic transfer line or the inversion thereof;
   a digital-to-analog converter that generates an analog signal from the digital corrected signal, the non-linear distortions generated in the amplifier being compensated for by correction of the output signal by of the stored characteristic transfer line of the amplifier or the inversion thereof stored so that a low-distortion amplification results in spite of the non-linearity of the amplifier,
   means for the measurement-technical evaluation of the input signal of the amplifier, and
   means for processing the data as well as a unit means for permanently storing the characteristic transfer line or its inversion on the one side and for modifying individual values during the operation through the means for processing the data on the other side wherein the input signal of the amplifier is measurement-technically detected by the means for the measurement-technical evaluation and supplied to the means for processing the data which then carries out a comparison between desired and actual values and corrects the characteristic stored transfer line for permanently storing upon deviations whereby the function of the device remains always guaranteed even with variations of the characteristic line.

20. The device according to claim 19, wherein the means for permanently storing is at first initialized with the function y=x and that after a short time the characteristic line of the amplifier or of the inversion thereof adjusts itself independently on account of the function of the device.

21. The device according to claim 19, wherein the non-linear amplifier is a general amplifier for the amplification of voltage, current or power.

22. The device according to claim 19, wherein the non-linear amplifier is the output stage of an audio amplifier.

23. The device according to claim 19, wherein the non-linear amplifier is a preamplifier stage of an audio amplifier.

24. The device according to claim 19, wherein the digital-to-analog converter generates the signal in such a manner that an analog output stage of the audio amplifier can be directly controlled.

* * * * *